United States Patent
Anami

(10) Patent No.: US 8,680,759 B2
(45) Date of Patent: Mar. 25, 2014

(54) LIGHT EMITTING MODULE AND ILLUMINATION APPARATUS

(75) Inventor: Shinichi Anami, Osaka (JP)

(73) Assignee: Panasonic Corporation, Osaka (JP)

( * ) Notice: Subject to any disclaimer, the term of this patent is extended or adjusted under 35 U.S.C. 154(b) by 23 days.

(21) Appl. No.: 13/565,054

(22) Filed: Aug. 2, 2012

(65) Prior Publication Data

US 2013/0076229 A1    Mar. 28, 2013

(30) Foreign Application Priority Data

Sep. 22, 2011    (JP) .................................. 2011-208014

(51) Int. Cl.
*H01J 1/62* (2006.01)
(52) U.S. Cl.
USPC .......................................... 313/498; 313/506
(58) Field of Classification Search
USPC ......................................... 313/498, 506, 512
See application file for complete search history.

(56) References Cited

U.S. PATENT DOCUMENTS

| | | |
|---|---|---|
| 2007/0128966 A1 | 6/2007 | Beeken et al. |
| 2009/0166657 A1 | 7/2009 | Yamada et al. |
| 2010/0148127 A1 | 6/2010 | Ellinger et al. |
| 2010/0157585 A1 | 6/2010 | Diekmann et al. |

FOREIGN PATENT DOCUMENTS

| | | |
|---|---|---|
| EP | 2 200 105 | 6/2010 |
| JP | 2000-040586 | 2/2000 |
| JP | 2007-200627 | 8/2007 |
| WO | 2008/040323 | 4/2008 |

OTHER PUBLICATIONS

European Search Report for corresponding European Application No. 12005599.1-1552 dated Mar. 25, 2013.

*Primary Examiner* — Vip Patel
(74) *Attorney, Agent, or Firm* — Renner, Otto, Boisselle & Sklar, LLP

(57) ABSTRACT

A light emitting module has a flat light emitting panel including a transparent substrate and a light emitting part formed on the substrate. The flat light panel includes: electrode pads which are formed on the substrate outward of the light emitting part and are electrically connected to the light emitting part; and a transparent or light reflective sealing member which is provided to cover the electrode pad.

7 Claims, 4 Drawing Sheets

LIGHT EMITTING MODULE AND ILLUMINATION APPARATUS

FIELD OF THE INVENTION

The present invention relates to a light emitting module including electroluminescence (EL) elements used as a light source, and an illumination apparatus including same.

BACKGROUND OF THE INVENTION

An organic EL element has the ability to emit light with high luminance at a high voltage and with various colors depending on the kind of organic compounds, and can be easily manufactured as a flat light emitting panel. Thus, in recent years, a light emitting module provided with a light emitting panel using organic EL elements has been in the spotlight.

FIG. 10 shows this kind of light emitting module. As shown, a light emitting module 103 includes a light emitting panel 102 in which a light emitting part 122 is formed on a transparent substrate 121 via a transparent electrode 122a; and a wiring circuit board 106 for supplying a power to the light emitting panel 102 (see, e.g., Japanese Patent Application Publication No. 2007-200627). The light emitting panel 102 includes an electrode pad 123 connected to the light emitting part 122 through the transparent electrode 122a; and a sealing tube 124 which seals the light emitting part 122. The wiring board 106 is fastened to the light emitting panel 102 by means of a fastener 109 such as an adhesive tape. The light emitting panel 102 is electrically connected to the wiring board 106 by connecting the electrode pad 123 to an electrode pad 162 formed on the wiring circuit board 106 by using a bonding wire 108.

However, in the light emitting module 103 as configured above, some lights "L" of the lights emitted from the light emitting part 122 are guided in the substrate 121 without penetrating through the substrate 121. The lights L laterally guided in the substrate 121 are outputted in a lateral direction of the substrate 121 and in a non-emission direction of the light emitting module 103, and thus cannot be used as effective light. As a result, fewer lights are outputted in the front direction of the light emitting module 103, thereby deteriorating light use efficiency.

SUMMARY OF THE INVENTION

In view of the above, the present invention provides a light emitting module and an illumination apparatus including same, capable of improving light use efficiency by directing lights, which are guided from a light emitting part into a substrate, in the front direction of the light emitting module.

In accordance with an aspect of the present invention, there is provided a light emitting module including a flat light emitting panel having a transparent substrate and a light emitting part formed on the substrate. The flat light panel includes: electrode pads which are formed on the substrate outward of the light emitting part and are electrically connected to the light emitting part; and a transparent or light reflective sealing member which is provided to cover the electrode pad.

The light emitting module may further include a case which covers a non-emission surface of the light emitting panel and has a light reflective surface facing the sealing member.

In the light emitting module, the sealing member may contain a light scattering material.

In the light emitting module, the sealing may be made of a substantially white material.

In the light emitting module, a layer may be formed on a surface of the substrate positioned outward of the light emitting part to diffuse lights outputted from the light emitting part and guided into the substrate.

The light emitting module may be used in an illumination apparatus.

With the light emitting module in accordance with the aspect of the present invention, some of lights guided from the light emitting part into the substrate are incident into the sealing member and are totally reflected into the non-emission surface of the sealing member or are reflected in the interface between the substrate and the sealing member, and thus outputted from the substrate in the front direction of the light emitting module, which can result in improvement in light use efficiency.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
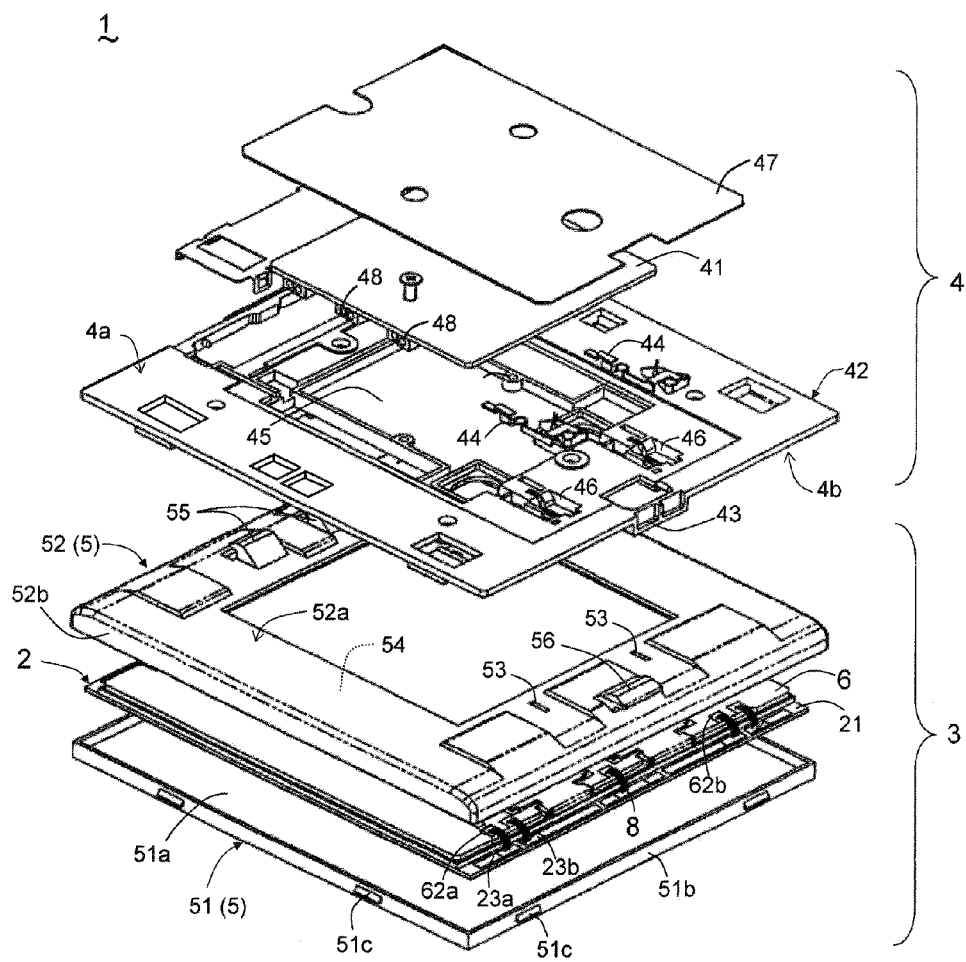
FIG. 1 is an exploded perspective view of an illumination apparatus including a light emitting module in accordance with an embodiment of the present invention.

A light emitting module and an illumination apparatus including same in accordance with an embodiment of the present invention will now be described with reference to FIGS. 1 to 6 which form a part hereof. As shown in FIG. 1, in this embodiment, an illumination apparatus 1 includes a light emitting module 3 (a light source part) having a flat light emitting panel 2 including organic EL elements; and a mounting part 4 which is detachably mounted on the light emitting module 3. The mounting part 4 is attached to a ceiling or a wall via an installation surface 4a, and the light emitting module 3 is mounted on the mounting part 4 to emit lights toward a living space and the like.

The light emitting module 3 includes a transparent cover 51 which is provided in an emission side (a lower side in FIG. 1) of the light emitting panel 2 and through which light is emitted; and a case 52 which is provided to cover a non-emission side (an upper side in FIG. 1) of the light emitting panel 2 and hold the cover 51. The cover 51 and the case 52 constitute a package 5. This package accommodates therein the light emitting panel 2 and a wiring circuit board 6 which is mounted on the non-emission side of the light emitting panel 2 and supplies a power to the light emitting panel 2. The mounting part 4 includes a circuit board 41 which controls turning on and off of the light emitting panel 2; and a housing 42 which accommodates the circuit board 41 therein.

Figure 2:
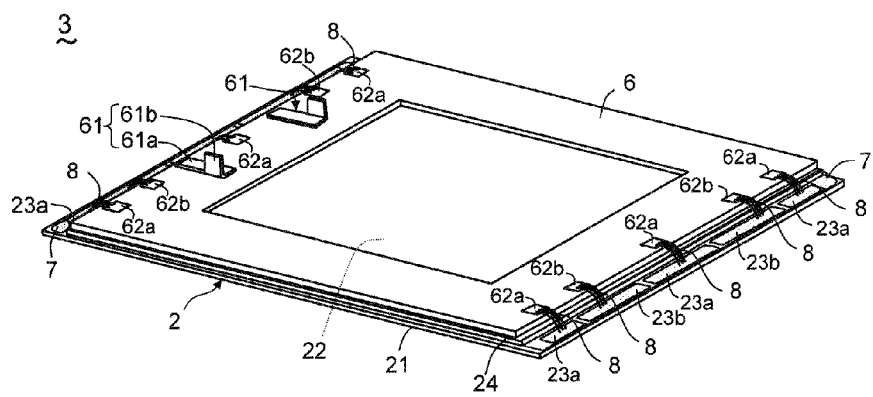
FIG. 2 is a perspective view of a circuit board and a light emitting panel of the light emitting module.
Figure 3:
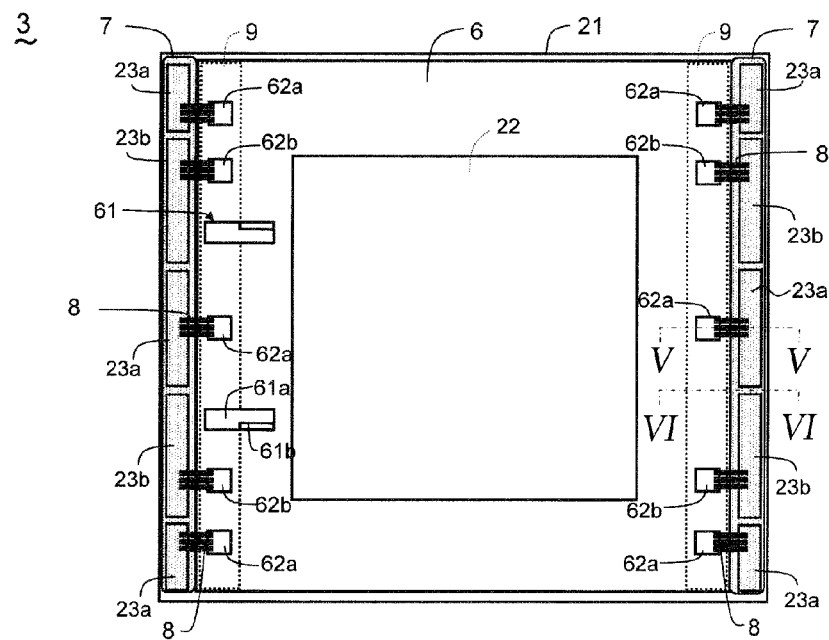
FIG. 3 is a front view of the circuit board and the light emitting panel of the light emitting module.
Figure 4:
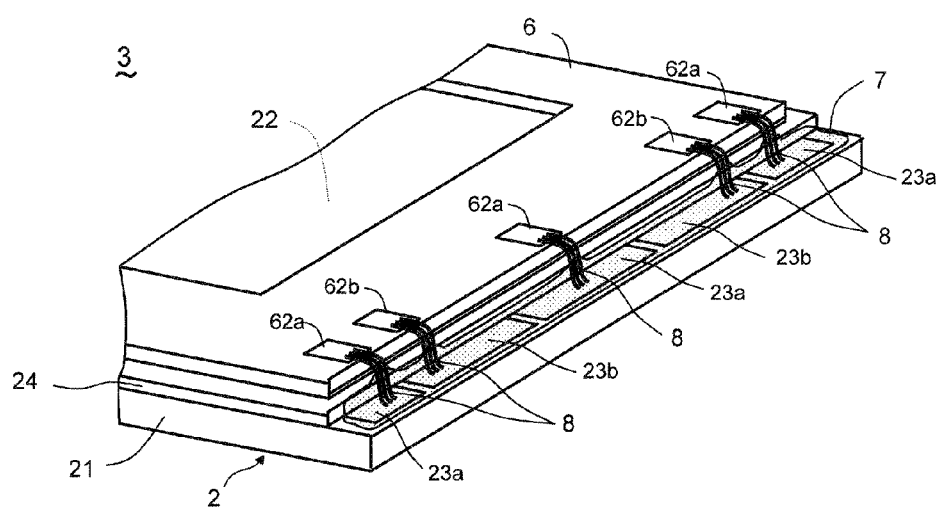
FIG. 4 is a partial enlarged perspective view of the circuit board and the light emitting panel of the light emitting module.

As shown in FIGS. 2 to 4, the light emitting panel 2 includes a rectangular transparent substrate 21; and a light emitting part 22 in which a light emitting layer and a light reflective cathode are stacked in order, with a patterned transparent electrode (not shown) interposed therebetween, on the substrate 21. Materials generally used in manufacturing organic EL elements are also used for a substrate, a transparent electrode (anode), a light emitting layer and a cathode.

On a side of the substrate 21 on which the wiring board 6 is provided, light emitting panel-side electrode pads 23a and 23b are formed at a position outward of the light emitting part 22. The electrode pads 23a and 23b are formed along opposite end portions of the substrate 21 and are electrically connected to the light emitting part 22 via a transparent electrode 22a (see FIG. 5 which will be described later) and the cathode in such a way that the electrode pads 23a corresponding to the anode and the electrode pads 23b corresponding to the cathode are alternately arranged side by side.

As such, by dispersively arranging the electrode pads 23a and 23b around the light emitting part 22, a current flowing into the light emitting part 22 can be made uniform to thereby uniformalize a surface emission luminance of the light emitting part 22. The light emitting part 22 is covered by a sealing tube 24 (see FIG. 5 which will be described later) which protects a light emitting layer and the like of the light emitting part 22 containing an organic material from water, oxygen and the like. The sealing tube 24 is of a box type corresponding to an external appearance of the cathode side of the light emitting part 22 and is made of a transparent material such as glass or the like. The electrode pads 23a and 23b are covered by a sealing resin member 7.

For the wiring board 6, a member including a flame-retardant and low-conductive substrate having a central-opened frame shape is used. As this substrate, a glass fiber plate, such as FR-4 or the like, is used. The glass fiber plate is obtained by impregnating a glass fiber tissue with an epoxy resin or the like and then curing same. The wiring board 6 has a terminal 61 which is formed on a surface thereof facing the case 52 (see FIG. 1) and electrically connects the wiring substrate 6 and the circuit board 41 of the mounting part 4. The terminal 61 includes a fastener 61a fastened to the wiring board 6; and a flat knife-shaped contact portion 61b erected from the fastener 61a. The contact portion 61b inserted through a groove portion 53 (see FIG. 1) formed in the case 52 and is exposed to the mounting part 4. In this example, a pair of terminals 61 is formed in one end portion of the wiring board 6.

In addition, wiring board-side electrode pads 62a and 62b are formed on the wiring board 6 in the vicinity of the electrode pads 23a and 23b when viewed from top.

In addition, anode and cathode lines (not shown) electrically connected to the terminals 61 are formed on the wiring board 6. These electrode lines are coated with an insulating material and some portions of the electrode lines are exposed to a surface of the wiring board 6 opposite to a surface thereof facing the light emitting panel 2 so as to be connected to the electrode pads 62a and 62b. The electrode pads 62a and 62b are respectively wired to the electrode pads 23a and 23b via conductive bonding wires 8, the electrode pads 23a and 23b being respectively electrically connected to the anode and cathode of the light emitting panel 2.. The light emitting panel 2 and the wiring board 6 are adhered and fixed together by means of an attachment member 9 (see FIG. 5 which will be described later), such as an acryl double-sided adhesive tape, containing a core material with high heat resistance, moisture resistance and stress relaxation property.

A configuration of the package 5 (the cover 51 and the case 52) of the light emitting module 3 and the mounting part 4 will be described with reference to FIG. 1. The cover 51 is of a box shape having an opened surface in the case 52 side and thus has a light emission surface 51a through which light is emitted from the light emitting panel 2; and a sidewall 51b which is erected from an outer periphery of the light emitting surface 51a and covers an outer peripheral surface of the light emitting panel 2.

The sidewall 51b has an inner peripheral surface formed to conform to the outer peripheral surface of the light emitting panel 2.

Thus, by merely inserting the light emitting panel 2 into the cover 51, it is possible to position the light emitting panel 2 and the wiring board 6 with ease. The sidewall 51b of the cover 51 has fitting clicks 51c which are formed on its peripheral surface to engage the cover 51 with the case 52. The fitting clicks 51c are formed to project in the circumferential direction of the light emitting surface 51a and are provided with a predetermined interval in the outer peripheral surface of the sidewall 51b. The cover 51 may be made of, for example, a plastic resin such as a transparent ABS resin, an acryl resin, a polystyrene resin or the like.

The case 52 is of a box shape having an opened surface (rear surface) in the cover 51 side. The case 52 has a concave main surface 52a and a sidewall 52b which is erected from a periphery of the main surface 52a and covers the outer peripheral surface of the sidewall 52b of the cover 51. The sidewall 52b has fitting grooves (not shown) which are formed in its inner peripheral surface and engage with the fitting clicks 51c of the cover 51. The fitting grooves are provided at a position in the sidewall 52b, corresponding to the fitting clicks 51c.

The case 52 has a front surface whose circumference is formed to be convex in the mounting part 4 side, and includes a concave wiring board receiving part 54 which receives the wiring board 6 in a rear surface of the convex portion. The wiring board receiving part 54 has a frame shape corresponding to the wiring board 6. The case 52 further includes a pair of engaging portions 55 formed in one end of its non-emission side. The engaging portions 55 engage with engaged portions (not shown) formed in a mounting surface 4b of the mounting part 4 on which the light emitting module 3 is to be mounted. The engaging portions 55 have their leading ends formed in a hook shape toward the outer side, and the engaged portions of the mounting part 4 are formed in a shape corresponding to the engaging portions 55. In a state where the engaging portions 55 engaged with the engaged portions, the light emitting module 3 is rotatable with respect to the mounting part 4.

The case 52 further includes a holding portion 56 formed in an end of the main surface 52a other than its one end in which the engaging portions 55 are formed. The holding portion 56 is held in a held portion 43 which is formed in the mounting surface 4b of the mounting part 4. Like the engaging portions 55, the holding portion 56 has its leading end formed in a hook shape toward the outer side, and the held portion 43 is formed in a shape corresponding to the holding portion 56. The holding portion 56 and the held portion 43 are held under a state where the light emitting module 3 is mounted on the mounting part 4. That is, the light emitting module 3 is mounted on the mounting part 4 by engaging the engaging portion 55 with the engaged portions of the mounting part 4 and rotating one ends of the engaged engaging portions 55 by use of the other ends as an axis to engage the holding portion 56 with the held portion 43.

The case 52 is generally made of the same material as the cover 51 but may be made of an opaque material such as a metal material, for example, aluminum having a surface subjected to an insulating treatment, the material having an elasticity to allow the sidewall 52b to be slightly bent. An angled portion connecting the main surface 52a and sidewall 52b of the case 52 is preferably partially chamfered as shown in FIG. 1. This helps to make an external appearance of the light emitting module 3 slim.

The mounting part 4 includes a pair of terminal receiving portions 44 which electrically connect the terminals 61 (see FIG. 2) and the circuit board 41, in addition to the circuit board 41 and the housing 42. The housing 42 is formed in a convex shape in the light emitting module 3 side and has a concave circuit board receiving portion 45 which receives the circuit board 41. In addition, the housing 42 has through grooves 46 through which the terminals 61 are inserted.

A protective member 47 for protecting the circuit board 41 is mounted on the circuit board 41. The circuit board 41 is formed of a same material as that of the wiring board 6, and various devices (not shown), such as a driver for turning on/off the light emitting panel 2 and so on, are mounted on a surface of a rectangular base at the side of the light emitting module 3. The circuit board 41 is provided with joining portions to the terminal receiving portions 44 and external power supply terminals 48. The joining portions, the external power supply terminals 48, the driver and the like are electrically interconnected by a wiring pattern formed on the circuit board 41.

The terminal receiving portions 44 are a pair of metal pieces bent into an L-like shape and each has one end fixed to the circuit board 41 and the other end erected toward the light emitting module 3, thereby forming a clip-shaped contact point which holds the corresponding terminal 61 inserted through the through the groove 46. Thus, electrical connection between the terminal receiving portions 44 and the terminals 61 is achieved.

Figure 5:
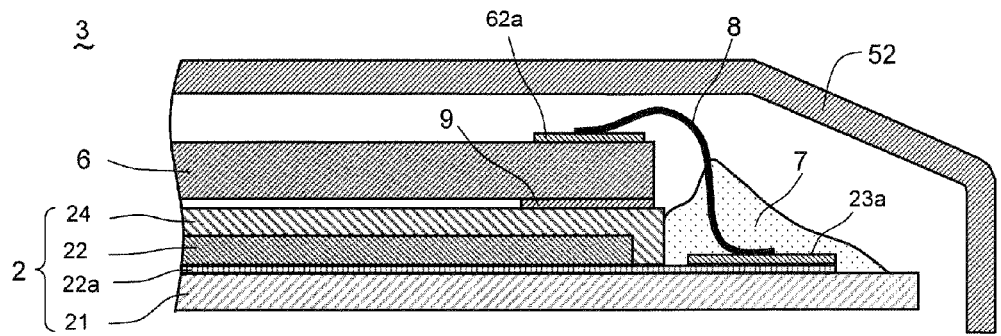
FIG. 5 is a sectional view taken along line V-V in FIG. 3.
Figure 6:
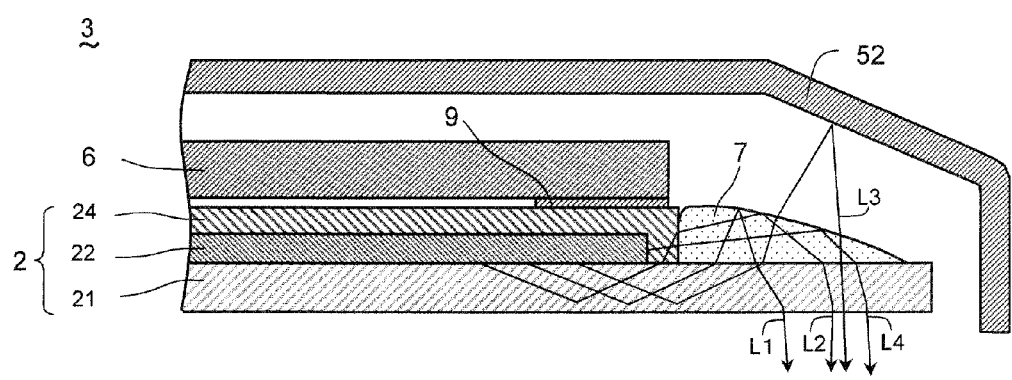
FIG. 6 is a sectional view taken along line VI-VI in FIG. 3.

Next, a joint structure of the light emitting panel 2 and the wiring board 6 will be described with reference to FIGS. 5 and 6 in addition to FIG. 4. FIG. 5 is a side sectional view in a position where the electrode pads 62a and the wire 8 are formed (specifically, taken along line V-V in FIG. 3) and FIG. 6 is a side sectional view in a position where the electrode pads 62a and the wire 8 are not formed (specifically, taken along line VI-VI in FIG. 3). FIG. 5 shows a section which traverses the electrode pads 23a and 62a corresponding to the anode.

In the meantime, a section which traverses the electrode pads 23b and 62b corresponding to the cathode has a different structure of drawing an electrode from the light emitting part 22 to the electrode pads 23b but has the same joint structure of the electrode pads 23b and 62b as the anode side, and therefore, is not shown for the purpose of avoiding complexity. For the sake of convenience, the cover is not shown in FIGS. 5 and 6 and the transparent electrode 22a of the light emitting part 22 is not shown in FIG. 6. This is true in modifications of the embodiment, which will be described later.

The wiring board 6 is adhered and fixed to the sealing tube 24 by means of the attachment member 9 such as an adhesive tape or the like. The attachment member 9 is provided immediately below a portion where the electrode pads 62a and 62b are formed in a surface of the wiring board 6 facing the sealing tube 24. The attachment member 9 may be arranged either in the form of dots corresponding to the electrode pads 62a and 62b or in the form of lines conforming to the electrode pads 62a and 62b (see FIG. 3). In a state where the light emitting panel 2 and the wiring board 6 are fixed together, the electrode pads 62a and 62b are wired to the electrode pads 23a and 23b by means of the wire 8.

A plurality of (3 in this example) wires 8 are preferably provided to wire the electrode pads. This can makes it possible to prevent electrical connection between the electrode pads from being cut even if any wire 8 is disconnected but if the remaining wires 8 are not disconnected, which can result in uniform emission of the light emitting part 22. An example of the wires 8 may include a pure aluminum line which can bond conductive layers of each electrode terminal in a short time at a room temperature by means of ultrasonic bonding.

A diameter of the wire 8 is determined in consideration of current consumption, material and so on of the light emitting panel 2. For example, if a current consumed is 1A, a wire having a line diameter of more than 100 μm with a fusing current of 2A is used in consideration of a safety factor of 50%. The wire 8 may be a copper or gold wire instead of the aluminum wire.

After completing the boding of the wire 8, the sealing resin member 7 is provided to cover the electrode pads 23a and 23b from a side end of the sealing tube 24 sealing the light emitting part 22.

The sealing resin member 7 is made of a transparent resin material such as, for example, a silicone resin, an epoxy resin or the like. If such a resin material has a refractive index which is equal to or greater than that of the substrate 21, it is possible to prevent total reflection at an interface between the substrate 21 and the sealing resin member 7. The sealing resin member 7 is formed by applying its resin material by a dispenser or the like in such a way that the resin material covers the electrode pads 23a and 23b from the side end of the sealing tube 24. That is, along with a bonded end of the wire 8, the electrode pads 23a and 23b are covered by the sealing resin member 7. At this time, when the resin material is applied, the sealing resin member 7 has a low fluidity near the side end of the wire 8 and the side end of the sealing tube 24, which increases a thickness of the sealing resin member 7 near the side end of the wire 8 and the side end of the sealing tube 24 but decreases a thickness thereof toward the periphery of the substrate 21. Consequently, a surface of the sealing resin member 7 facing the case 52 has a slope inclined toward the periphery of the substrate 21.

With the above configuration, as shown in FIG. 6, some, e.g., lights L1, of lights propagated from the light emitting part 22 into the substrate 21 are incident into the sealing resin member 7 and totally reflected from an interface of the sealing resin member 7 facing the case 52. Then, the totally reflected lights L1 are transmitted through the substrate 21 and outputted from the substrate 21 in a light irradiation (front) direction of the light emitting module 3. In addition, lights L2 incident from the substrate 21 into the sealing tube 24 are also incident from the side end of the sealing tube 24 into the sealing resin member 7, and then are outputted from the substrate 21 after being totally reflected from the interface.

In addition, the case 52 is configured to have a light reflective surface facing the sealing resin member 7. For example, a surface facing the sealing resin member 7 is coated with a material having a high light reflectivity, such as a white paint or the like, or a highly light reflective metal film. With this configuration, lights L3 incident into the sealing resin member 7 with a small incidence angle with respect to the interface of the sealing resin member 7 are transmitted through the sealing resin member 7 without being totally reflected, but are reflected by the case 52. The light L3 are transmitted through the sealing resin member 7 and the substrate 21, and are outputted in the front direction of the light emitting module 3. In addition, since an end of the case 52 is formed to be inclined, the lights L3 transmitted through the sealing resin member 7 can be effectively reflected. Further, lights L4 outputted laterally from the light emitting part 22 and incident into the sealing tube 24 without being incident into the substrate 21 are also incident into the sealing member 7 and outputted in the front direction of the light emitting module 3.

Figure 7:
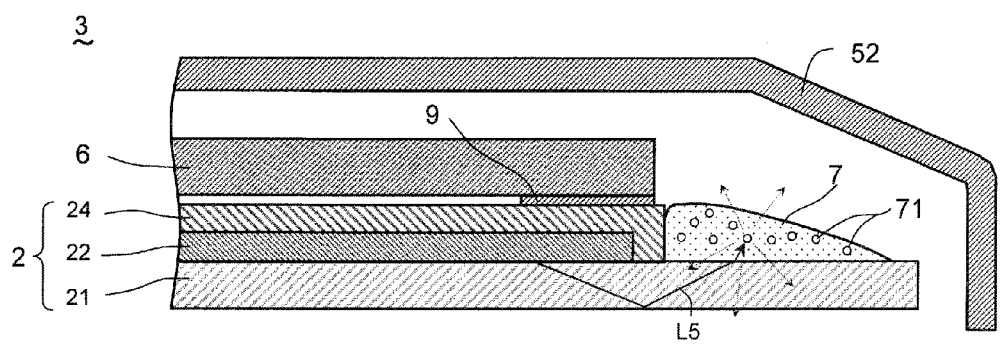
FIG. 7 is a side sectional view of a light emitting module in accordance with a modification of the embodiment.

With the light emitting module 3 as configured above, it is possible to improve light use efficiency by drawing light, which guided from the light emitting part 22 into the substrate 21, in the front direction of the light emitting module 3. In addition, by providing the sealing resin member 7, it is possible to protect a bonding portion between the electrode pads 23a and 23b and the wire 8 while preventing water, oxygen and the like from permeating into the light emitting part 22. A light emitting module 3 in accordance with a modification of the above-described embodiment will be now described with reference to FIG. 7. The light emitting module 3 in accordance with this modification includes a sealing resin member 7 containing a light scattering material 71. An example of the light scattering material 71 may include, for example, light scattering particles of titanium oxide or the like.

With this configuration, lights L5 incident into the sealing resin member 7 are reflected and diffused by the light scattering material 71, and are thus outputted in the front direction of the light emitting module 3. In addition, among the lights diffused by the light scattering material 71, lights guided in a non-emission surface direction are totally reflected from an interface of the sealing resin member 7 facing the case 52 or are reflected by the case 52 and drawn in the front direction of the light emitting module 3. Consequently, like the above-described embodiment, in accordance with this modification, it is possible to improve light use efficiency by drawing light, which guided from the light emitting part 22 into the substrate 21, in the front direction of the light emitting module 3.

Figure 8:
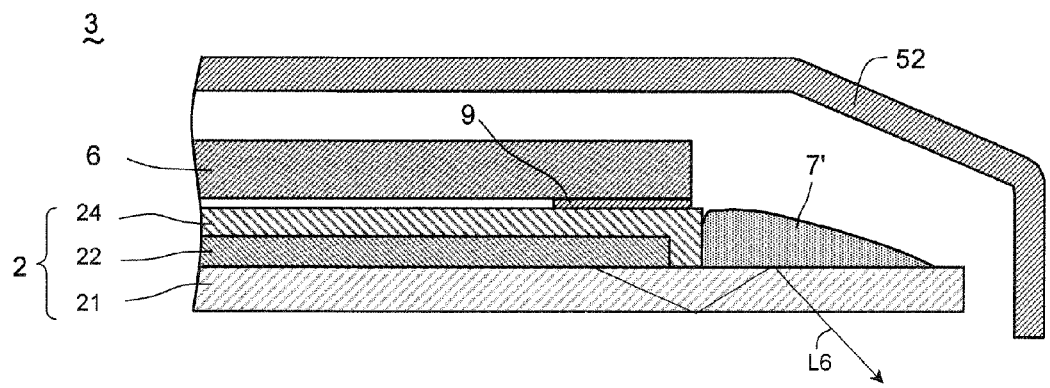
FIG. 8 is a side sectional view of a light emitting module in accordance with another modification of the embodiment.

A light emitting module 3 in accordance with another modification of the above-described embodiment will be now described with reference to FIG. 8. The light emitting module 3 in accordance with this modification includes a sealing resin member 7' that is mainly made of a white material. With this configuration, some, e.g., lights L6, of lights guided from the light emitting part 22 into the substrate 21 are reflected from an interface between the substrate 21 and the sealing resin member 7' and are thus outputted in the front direction of the light emitting module 3. Consequently, this modification provides a less amount of lost light outputted from the sealing resin member 7' to the case 52 side, which may result in high light use efficiency.

Figure 9:
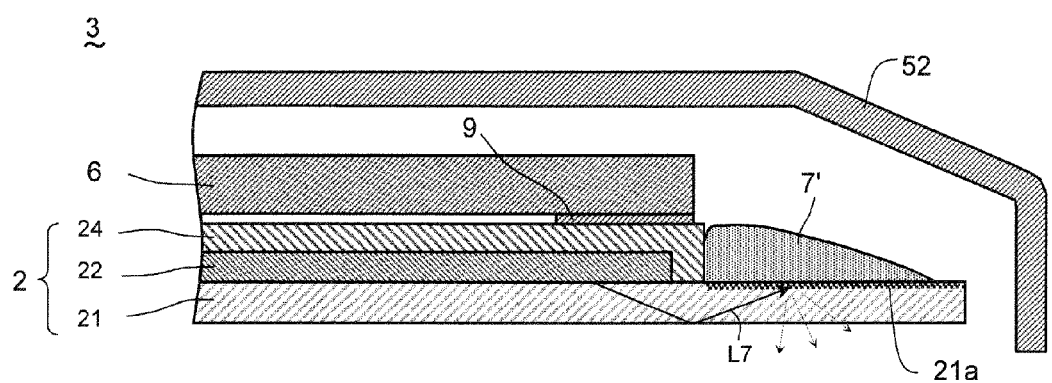
FIG. 9 is a side sectional view of a light emitting module in accordance with still another modification of the embodiment.
Figure 10:
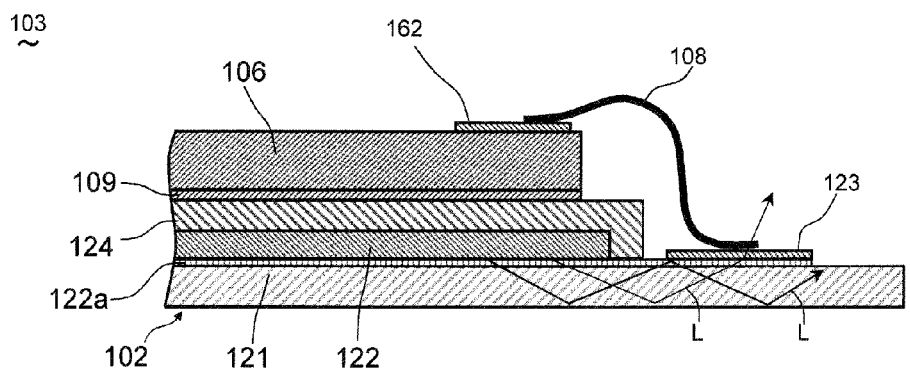
FIG. 10 is a side sectional view of a conventional light emitting module.

A light emitting module 3 in accordance with still another modification of the above-described embodiment will be now described with reference to FIG. 9. The light emitting module 3 in accordance with this modification includes a diffusing layer 21a which is formed on the substrate outside the sealing tube 24 (or the light emitting part 22) and diffuses lights outputted from the light emitting part 22 and guided into the substrate 21. The sealing resin member 7' is made of the same white material as in the above-described another modification. The diffusing layer 21a is formed by printing a reflective material on the substrate or subjecting the substrate 21 to a grooving processing or a micro prism processing.

With this configuration, the diffusing layer 21a serves to suppress the total reflection of lights L7 which are incident and guided from the light emitting part 22 into the substrate 21 and reflect the lights L7 by the white sealing resin member 7', thereby drawing lights in the front direction of the light emitting module 3. In addition, the diffusing layer 21a may be used in combination with the transparent resin material 7 shown in FIGS. 5 and 6 or the sealing resin member 7 containing the light scattering material 71 shown in FIG. 7.

While the invention has been shown and described with respect to the embodiments, it will be understood by those skilled in the art that various changes and modifications may be made without departing from the scope of the invention as defined in the following claims.

For example, the electrode pads 62a and 62b may be covered by a resin member in order to protect the wire 8 bonded to the electrode pads 62a and 62b. In addition, this resin member may be integrated with the sealing resin member 7 which covers the above-described electrode pads 23a and 23b. Moreover, the sealing rein which covers the electrode pads 62a and 62b is preferably formed such that its height is lower than the top of head of the arc-like wired 8. This helps to make the light emitting module 3 slim without increasing the thickness of the light emitting panel 3.

What is claimed is:

1. A light emitting module, comprising:
   a flat light emitting panel having a transparent substrate and a light emitting part formed on the substrate,
   wherein the flat light emitting panel includes:
   electrode pads which are formed on the substrate outward of the light emitting part and are electrically connected to the light emitting part; and
   a transparent or light reflective sealing member which is provided to cover the electrode pads,
   wherein a thickness of at least a part of the sealing member decreases toward a periphery of the transparent substrate.

2. The light emitting module of claim 1, further comprising:
   a case which covers a non-emission surface of the light emitting panel and has a light reflective surface facing the sealing member.

3. The light emitting module of claim 1, wherein the sealing member contains a light scattering material.

4. The light emitting module of claim 1, wherein the sealing member is made of a substantially white material.

5. The light emitting module of claim 1, wherein a layer is formed on a surface of the substrate positioned outward of the light emitting part to diffuse lights outputted from the light emitting part and guided into the substrate.

6. An illumination apparatus comprising the light emitting module of claim 1.

7. The light emitting module of claim 1, wherein at least the part of the sealing member is disposed in the vicinity of the periphery of the substrate.

* * * * *